US005852303A

United States Patent [19]

Cuomo et al.

[11] Patent Number: 5,852,303

[45] Date of Patent: Dec. 22, 1998

[54] AMORPHOUS MATRICES HAVING DISPERSED CESIUM

[76] Inventors: Jerome J. Cuomo, 78 Lovell St., Lincolndale, N.Y. 10540; Seong I. Kim, 438 Andre Ave., Northvale, N.J. 07647

[21] Appl. No.: 731,349

[22] Filed: Oct. 11, 1996

[51] Int. Cl.[6] .................... H01L 29/06

[52] U.S. Cl. .................... 257/9; 257/10; 257/77; 204/192.15; 428/426; 437/16; 437/105; 437/228; 250/427; 523/136; 423/446

[58] Field of Search .................... 250/427; 523/136; 257/77, 9, 10; 423/446; 428/426, 384; 204/192.1, 192.15; 313/346; 148/33; 437/225, 228, 233, 16, 105

[56] References Cited

U.S. PATENT DOCUMENTS

| | | | |
|---|---|---|---|
| 4,333,859 | 6/1982 | Vaughan et al. . | |
| 5,374,318 | 12/1994 | Rabalais et al. | 148/33 |
| 5,463,271 | 10/1995 | Geis et al. . | |
| 5,466,941 | 11/1995 | Kim | 250/423 |

OTHER PUBLICATIONS

D. Camino, et al., *Solar Energy Materials and Solar Cells* 39 (1995) pp. 349–366.

Geis et al., “Electron filed emission from diamond and other carbon materials after . . . treatment”, Lincoln Laboratory, Massachusetts Institute of Technology, Lexington, MA 02173–9108.

*Primary Examiner*—Laurie Scheiner

*Attorney, Agent, or Firm*—Cushman Darby & Cushman IP Group of Pillsbury Madison & Sutro, LLP

[57] ABSTRACT

A composition of matter in the form of an amorphous matrix having cesium dispersed therein is disclosed. The composition is capable of cold cathode emission, thus emitting electrons at wide range of temperatures, including room temperature. The matrix can be formed from amorphous diamond, diamond-like carbon, and other materials as well. Methods of making an amorphous matrix using single and multi-ion beam techniques are also disclosed.

8 Claims, 3 Drawing Sheets

132

AMORPHOUS MATRICES HAVING DISPERSED CESIUM

FIELD OF THE INVENTION

This invention relates to amorphous matrices for use as electron emitters. More particularly, it concerns amorphous matrices having a composite structure with cesium (Cs) atoms dispersed therein.

BACKGROUND

Researchers have experimented with a number of materials and processes for forming thin films which have good electron emission characteristics at low temperatures. On candidate material is amorphous diamond (a-D).

Amorphous diamond, which is made from a hard carbon composition, is similar to crystalline diamond in that it has a high density and it comprises tetrahedrally bonded carbon. However, it is in the amorphous phase and does not have long range order and therefore does not have the thermal conductivity of crystalline diamond. Amorphous diamond can be prepared with a wide range of $sp^3$ bonds vs. $sp^2$ bond ratios. Thus, it can have both a diamond ($sp^3$) and a graphitic component ($sp^2$). As its $Sp^3$ concentration approaches 100%, amorphous diamond is non-conductive and its density approaches that of crystalline diamond.

Previous attempts to achieve high electron emission from a-D has focused on providing an a-D surface with particulates, called aspirites, to form high field emission points. Other techniques have focused on providing an interface between a graphitic ($sp^2$) and a diamond ($sp^3$) region. Moderate electrons emission levels have been observed in a-D. However, such emission is irregular and not always repeatable from sample to sample.

Prior art studies have also examined the use of a cesium-rich layer deposited on the surface of a doped, crystalline diamond or amorphous carbon material. This work has been described in "Electron Field Emission From Diamond And Other Carbon Materials After $H_2$ and $O_2$ and Cs Treatment", M. W. Geis et al., IEEE Letters, vol. 12, pp. 456–8 (1991), and in U.S. Pat. No, 5,463,271, both of whose contents are incorporated by reference. In these references, the surface of the material is treated with $O_2$ and cesium is then deposited thereon. A thermal process for surface deposition, which uses low-energy, i.e, on the order of 0.1 eV, is employed to deposit the cesium. Surface treatment with $O_2$ and Cs deposition was found to enhance emission for doped crystalline diamond.

FIG. 1 shows a prior art device representative of surface-treated crystalline diamond. The prior art device comprises the carbon material 20 on which a layer of oxygen 21 is deposited. A cesium layer 22 is then deposited on top of the oxygen 21. The carbon substrate may be doped with N- or P-type dopants. It should be noted that the Cs is present only in the thin layer 22, and is not dispersed within the crystalline diamond or amorphous carbon substrate 20 itself.

Other efforts have focused on thin films formed from an amorphous matrix of $TiO_2$ which include nanocrystallites of $CeO_2$. This has been described in Camino, D. et al. $(CeO_2)_x(TiO_2)_{(1-x)}$ Counter Electrode Materials for Lithium Electrochromic Devices, Solar Energy Materials and Solar Cells, v. 39, n. 2–4, pp. 349–66, (1995). In such material, the cesium oxide is in a crystalline form, and so its crystalline structure can be detected through x-ray diffraction data.

SUMMARY OF THE INVENTION

One object of the invention is to provide a stable material having a low work function for emitting electrons, which material reliably provides electrons at cold cathode emission temperatures.

Another object of the invention is to provide an amorphous matrix having predominantly $sp^3$-bonded carbon having cesium dispersed therein, and further arranged to reliably provide cold cathode emission.

A further object of the invention is to provide methods for producing such a material.

A further object of the invention is to adapt such a material for use in applications calling for cold cathode emission.

A material in accordance with the present invention comprises an amorphous matrix having cesium dispersed therein, with the cesium being present in substantially non-crystalline form. In this context, 'matrix' refers to a 3-dimensional structure able to accommodate impurities, dopants, and the like, and 'non-crystalline' refers to the cesium being dispersed to such a degree that a crystalline structure cannot be detected by x-ray diffraction techniques.

In a preferred embodiment, the invention comprises a matrix formed from a base material of amorphous diamond or diamond-like carbon, the matrix having cesium dispersed therein. The cesium atoms are present in the matrix at a concentration ranging from 0.01–25% of the base material, and the matrix has at least 50% $sp^3$ bonding.

The matrix may also have dopants implanted therein to enhance its conductivity. Examples of suitable dopants include nitrogen (N), phosphorous (P), boron (B), sodium (Na), lithium (Li), though others may also be used.

Also contemplated in the present invention is a method for forming an amorphous matrix comprising the steps of providing a cesium source, a carbon target, and a substrate, bombarding the carbon target with the cesium source having enough energy to eject carbon atoms towards the substrate, and co-sputtering cesium and carbon atoms onto the substrate to grow an amorphous diamond matrix.

The invention also contemplates a second method for forming an amorphous matrix comprising the steps of providing a cesium source, a carbon target, a substrate, and an inert gas source, bombarding the carbon target with the inert gas source, the inert gas source having enough energy to eject carbon atoms towards the substrate, and simultaneously entraining cesium atoms with said cesium source.

In either of the two methods of the present invention, the concentration of cesium and the deposition rate of the carbon can be controlled by adjusting the energy (distribution of energies) and/or current density (number) of the particles emitted by the cesium and/or the inert gas sources.

A matrix formed in accordance with the present invention may be used in a number of applications such as magnetrons, video display terminals, electron microscopes, and other applications calling for electron emission.

DETAILED DESCRIPTION OF THE PREFERRED EMBODIMENT

Figure 1:
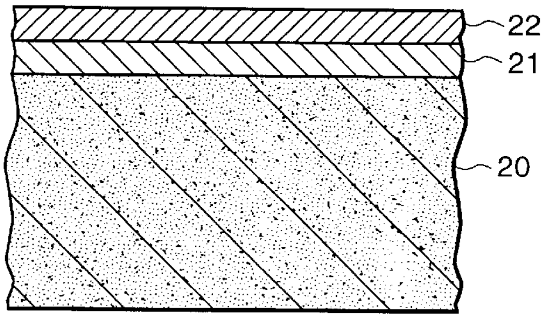
Fig. 1 (PRIOR ART)
FIG. 1 shows a cross-section of a prior art material comprising a thin cesium film provided atop an oxygen layer on top of a crystalline diamond or an amorphous carbon substrate.
Figure 2:
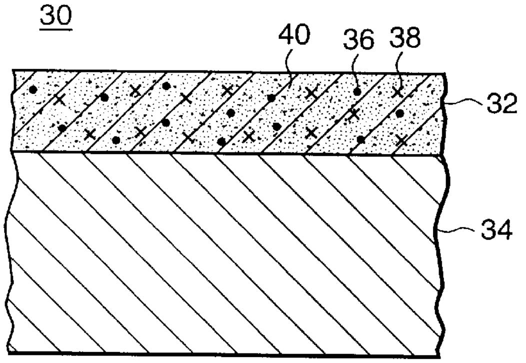
FIG. 2 shows an amorphous matrix having cesium dispersed therein, in accordance with the present invention.

FIG. 2 shows a device 30 in accordance with the present invention. The device comprises an amorphous matrix 32 comprising a base material, in this case, carbon. Cesium, either in atomic form, or compounded is dispersed throughout the matrix. The matrix is formed on a substrate 34 of the kind commonly used in thin film deposition. Suitable substrates include molybdenum, silicon, glass, titanium dioxide, etc.

The amorphous matrix 32 is preferably a carbon matrix having a high $sp^3/sp^2$ bond ratio. Cesium 36, preferably in ion form, is dispersed throughout the matrix. The principal component, i.e., the base material, of the matrix is carbon 40, which is largely in tetrahedrally bonded ($Sp^3$) form. The Cs, rather than occupying the place of carbon in the matrix, is found between the matrix's interstices. In the preferred embodiment, the cesium is not generally found in crystalline form. When in a non-crystalline form, a crystalline structure of the cesium within the amorphous matrix cannot be detected by x-ray diffraction. Instead, it is dispersed throughout at least a portion of the matrix 32, preferably as individual atoms and/or compounded with other different atoms. The portion of the matrix having cesium dispersed therein may be the entire matrix, as shown in FIG. 2; alternatively, it may just be a portion of the thickness of the matrix. What is important, is that the cesium be present within the matrix, and not just on the matrix surface, as disclosed in the prior art.

The amorphous matrix can include dopants 38. The dopants 38 increase the conductivity of the material and, as a consequence, serve to lower the work function of the amorphous matrix. This makes the resulting material amenable for use as an electron emitter. Whatever manner is used to introduce the dopants, it should be kept in mind that the purpose of the dopants is to lower the work function, and that this can happen by the addition of either N-type and P-type dopants. It should also be kept in mind that both N-type and P-type dopants may be used at the same time in an amorphous matrix of the present invention.

Figure 4A:
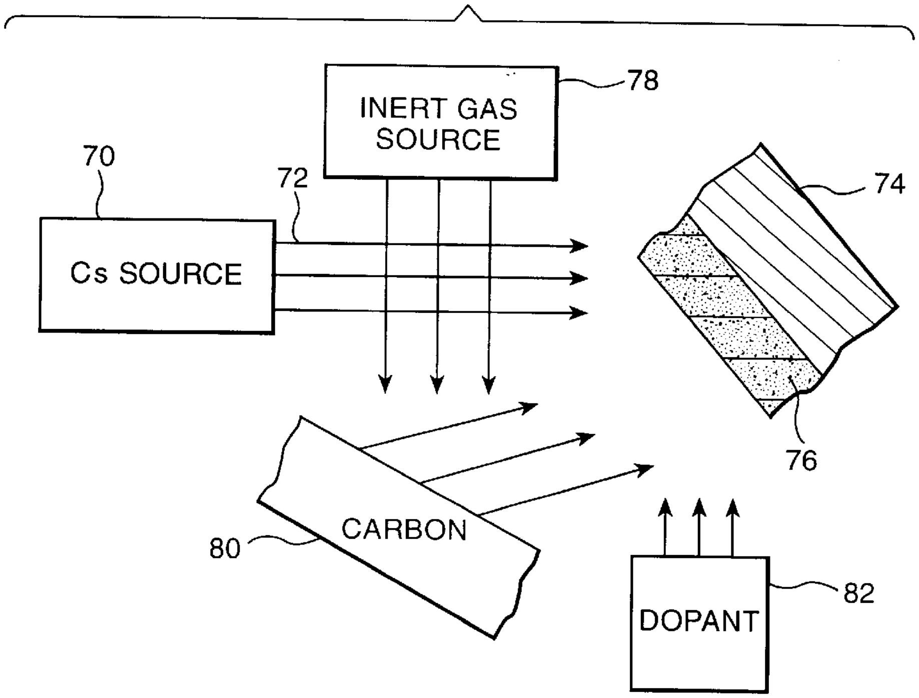
FIG. 4A shows a multi-ion beam deposition technique for forming an amorphous matrix.

The dopants can be introduced through one of a number of processes. For instance, the dopants can be co-implanted with cesium and carbon as the amorphous matrix is grown. Dopants such as nitrogen (N), phosphorous (P), and boron (B), which create an N-type material (N & P) or a P-type material (B), according to semiconductor principles, may be added by co-implantation. A second way to introduce the dopants is to implant them after the formation of the amorphous matrix. In such case, a high energy dopant ion beam is directed at an already grown amorphous matrix to implant the dopants. A third technique is to diffuse the dopants into an amorphous matrix. Dopants such as lithium (Li), sodium (Na), and the like may be introduced in such a manner. During diffusion, the dopants may also be added to the vapor stream by low-energy evaporation, or added in a gaseous form when compounded in a hydride such as $PH_3$ or $B_2H_4$, as shown in FIG. 4A.

When a high $sp^3$-ratio amorphous diamond matrix is grown with cesium incorporated therein, the matrix becomes conductive. This is a surprising phenomenon because diamond is a well-known wide bandgap semiconductor in which it is very difficult to get electrons into the conduction band. Thus, it is evident that cesium and cesium compounds incorporated into the bulk of a-D reduce the latter's work function for electron emission. Also, the surface conditions of the a-D are such that one can achieve cold-cathode emission. As discussed further below, amorphous matrices with cesium dispersed therein provide excellent conductors at temperatures at room temperature, e.g., 300° K.

In the preferred embodiment of the present invention, the cesium atoms are present in a stable, i.e., predominantly $sp^3$-bonded, amorphous matrix. The concentration of cesium in a composition of the present invention may have a fairly wide range, yet maintain the necessary stability. In this regard, it is possible to get suitable electron emission from amorphous diamond with a cesium content of 0.01% to 25% of the base material. Beyond 25%, the concentration of cesium atoms is so high that, statistically, cesium atoms will bond with each other, thus creating a condition where the matrix has a tendency to become less stable. Thus, to maintain a predominantly $sp^3$-bonded, stable amorphous matrix, it is preferable to have the cesium atoms isolated and not bonding to one another in the matrix, although clusters of cesium in non-crystalline form can exist in an amorphous matrix of the present invention. As stated above, the cesium in the matrix is not found in a crystalline form, and so a cesium crystalline structure cannot be detected by x-ray diffraction.

Amorphous diamond having 28% $sp^2$ bonds and 72% $sp^3$ bonds still acts like crystalline diamond at a wide range of temperatures. However, when the $sp^2$ proportion rises to 50%, the material degrades as the temperature is increased. Thus, the concentration of $sp^3$ is preferably kept above the 50% figure.

There are a number of ways in which cesium atoms can be dispersed throughout an amorphous diamond matrix. All of these entail the formation of high-energy carbon atoms which are then deposited along with cesium, as the amorphous matrix is grown. Thus, unlike the surface treatment taught in U.S Pat. No. 5,463,271, the cesium is incorporated into the amorphous matrix as the latter is grown, and is not simply deposited on the surface of a crystalline diamond or amorphous carbon.

Figure 3:
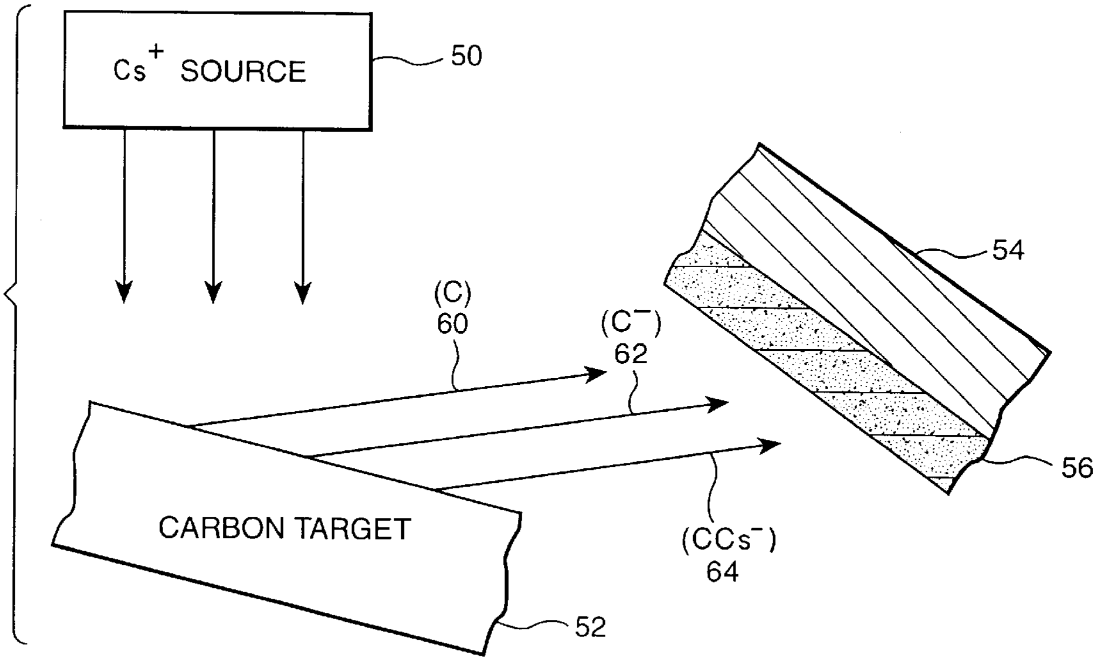
FIG. 3 shows a single-ion beam deposition technique for forming an amorphous matrix in accordance with the present invention.

FIG. 3 illustrates the single-ion beam technique for forming an amorphous matrix in accordance with the present invention. A cesium source 50 provides an ion beam which bombards a (carbon) graphite target 52. The carbon target 52 may be pure carbon or may be doped with various impurities. Typical impurities with which a carbon target is doped include B, P, N and Oxygen (O), although other impurities may also be used.

An example of a suitable arrangement using a single ion beam and with a cesium source 50 is the Rectilinear Ion Beam Source, such as that described in U.S. Pat. No. 5,466,941, whose contents are incorporated by reference. Such a source can produce a stream of positive $Cs^+$ ions having an energy predominantly in the range of 50–1000 electron volts (eVs). As is known to those familiar with such sources for bombarding targets, the number of bombardants, and the average energy of these bombardants can be controlled. However, the energy of each bombardant is not controlled to the extent that each has the same exact energy; instead, the population of bombardants follows a statistical distribution. As a consequence, some of the bombardants have sufficient energy to dislodge carbon atoms, while others do not.

By controlling the energy and/or the current density of the source, one can regulate the rate at which cesium is incorporated into the matrix. This allows one to ensure that the concentration of cesium is not so high that the cesium clusters into a crystalline form during the growth of the amorphous matrix. As is known to those skilled in the art, the energy and/or current density can be controlled in such a source with a fairly high degree of precision.

The highly electropositive cesium ions created by the cesium source transfer their momentum to the target. This produces energetic particles which are directed towards the substrate 54. Among these particles are carbon atoms 60, negative ions of carbon 62, and negative carbon-cesium ions 64. Other particles may also be formed. Dopants originally present in the carbon target 52 may also be dislodged and accelerated towards the substrate 54. The energy level of an ejected particle depends to a large extent on the energy level of the cesium ion which bombarded it. On average, high energy cesium ions impart higher energies to the particles they dislodge.

In general, the carbon atoms and other particles should have an energy between 1 and 200 electron volts (eVs) for them to be incorporated into an amorphous diamond matrix. As is the case with the cesium source, the energy levels of the dislodged carbon atoms follow a statistical distribution. Given sufficient energy, a carbon atom may be added to the growing amorphous matrix. Its energy also determines the likelihood that it will dislodge other atoms already present in the matrix. At the low end of this distribution, a carbon atom has so little energy that it cannot get incorporated into the growing amorphous matrix. At the high end of this distribution, the carbon atom is so energetic that it is highly likely to dislodge other carbon atoms already present in the growing matrix. Between the two extremes, the chance that a carbon atom will dislodge atoms already in the matrix varies. Thus, one may control the rate at which carbon atoms are added to the matrix (i.e., the rate at which the matrix grows) by controlling the energy of the carbon atoms. This, of course, can depend on the energy distribution of the particles bombarding the carbon target.

At the substrate 54, the various energetic carbon and cesium atoms and ions are quenched into the growing amorphous matrix 56. Thus, the carbon and cesium are co-sputtered in this process. Dopants, when present, are also quenched into the amorphous matrix.

The various particles must arrive with sufficient energy to be absorbed into the growing amorphous matrix 56. At the same time, their energy must not be so great that, when they impact the matrix, they dislodge particles which are already present. When the energy of the carbon atoms is too high, the rate of removal of atoms, exceeds the rate of deposition. As explained above, this is because the carbon is so energetic that it simply dislodges other atoms already present in the amorphous matrix 56. The energy of the particles arriving at the amorphous matrix, and thus the sputtering yield, can be controlled by adjusting the energy and/or the current density of the cesium source 50.

Figure 4B:
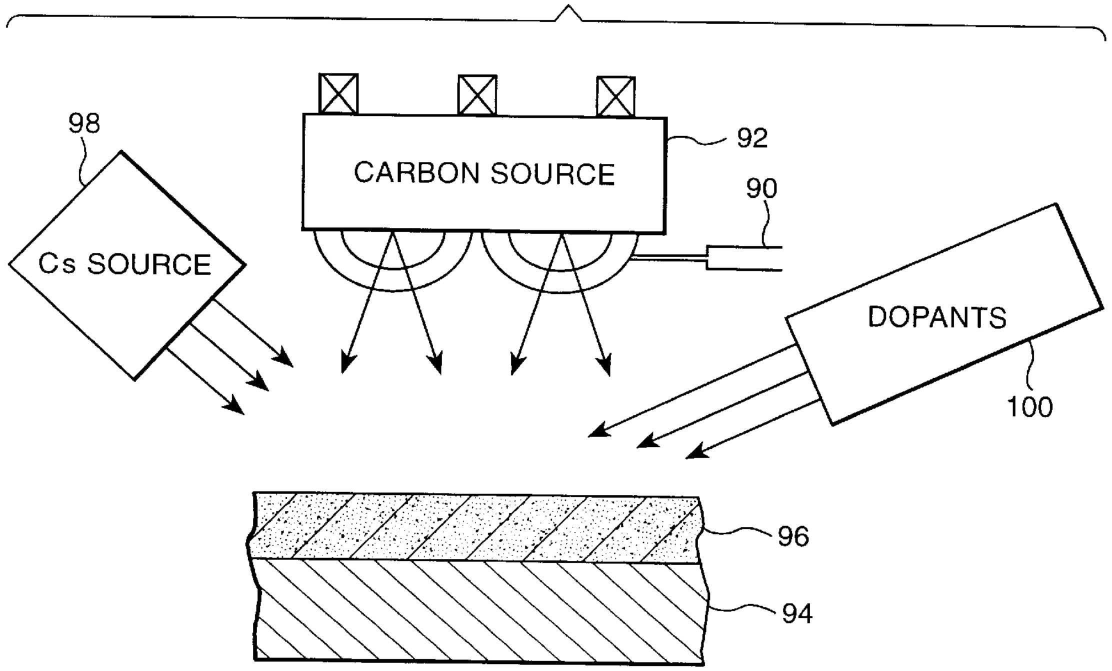
FIG. 4B shows another multi-ion beam deposition technique for forming an amorphous matrix.

FIGS. 4A–4B illustrates multi-ion beam approaches for co-depositing cesium and carbon. Multi-ion beam processes allow one to more precisely control the concentration of cesium in the amorphous matrix. This is done by adjusting the energy and/or current density of the various beams to thereby affect the arrival rate and the accumulation rates of the carbon, cesium and dopants, and other particles.

FIG. 4A shows one such multi-ion beam source. In FIG. 4, a cesium source 70 directs a beam of positively charged cesium ions 72 towards a substrate 74 on which an amorphous matrix 76 is grown. In this approach, an inert gas source 78 is used to bombard a carbon target 80. The inert gas source produces ions at an energy between 500–1000 eV, and its energy and/or current density may be controlled through conventional means, much as the cesium source discussed above. Preferably, the inert gas is Argon, although other gases may be used. Suitable inert gas sources for such purposes are well known in the prior art. Examples of such sources can be found, for example, in Cuomo, J. J. et al., Handbook of Ion Beam Processing, Noyes Publishing (1991), whose contents are incorporated herein by reference.

The bombarding beam of inert gas ejects and directs energetic carbon towards the substrate 74 where it is quenched into an amorphous matrix, along with the cesium ions 72. Other active species, which serve as dopants, may also be introduced through another source 82. These may include other gases such as $BH_3$, $B_2H_2$, $PH_3$, $N_2$, $NH_4$ urea, and mixtures thereof. Oxygen, on the other hand, may be deposited in vapor form through conventional methods.

The Cs beam, either by itself, or in conjunction with other active species are incorporated into the energetically condensing carbon to provide co-bombardment with oxygen or post treatment in an oxygen containing environment such as plasma where the sample is in contact with the plasma. Alternatively, the sample may be downstream from where the plasma is generated and the samples are only exposed to the active species and not to the plasma itself.

Alternatively, the argon source may be replaced by a second cesium source. In such case, the first cesium source is directed at the substrate to implant dispersed cesium into the amorphous matrix. The second cesium source, on the other hand, bombards the carbon target 80, thus ejecting carbon ions which accelerate towards the substrate, as in the single-ion beam case. The carbons ions resulting from the second source and the cesium ions from the first source together form the resulting matrix. Again, dopants may either be included in the carbon target, or may be separately diffused or implanted into the amorphous matrix.

When dual cesium sources are used, one may use a thermal deposition process to incorporate the cesium into the amorphous matrix. In such case, a cesium vapor is formed by thermal evaporation and the cesium vapor is entrained into the matrix.

FIG. 4B shows a second multi-ion beam arrangement. Here, an unbalanced magnetron 90 is used to create a magnetic field to eject and direct energetic carbon from a carbon target 92 towards a substrate 94 where it is quenched into an amorphous matrix 96. As before, a cesium source 98 and a dopant source 100 are used. Magnetron sputtering is known to those skilled in the art. Suitable magnetron sputtering apparati for such purposes are well known in the prior art and can be found in Rossnagel et al., Handbook of Plasma Processing, Noyes Publishing (1990), whose contents are incorporated by reference.

Figure 4C:
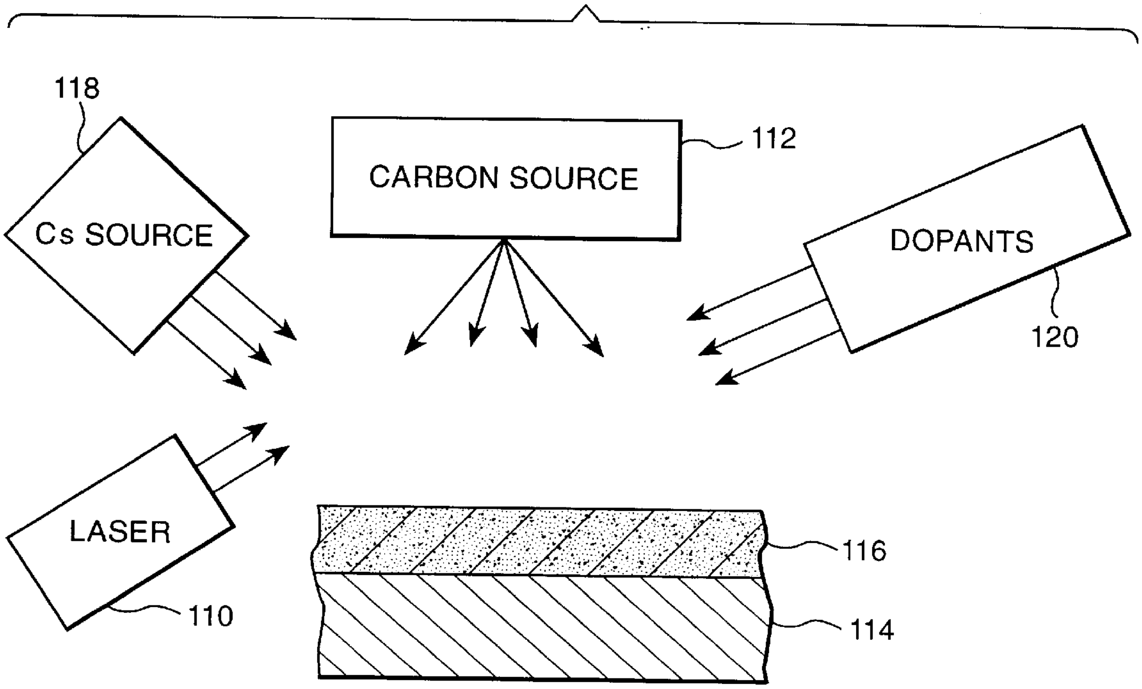
FIG. 4C shows yet another multi-ion beam deposition technique for forming an amorphous matrix.

FIG. 4C shows a third multi-ion beam arrangement which can also be used to form a device in accordance with the present invention. An laser 110, preferably an excimer laser, is directed at a carbon target 112. The laser ejects energetic carbon which is then directed towards a substrate 114 where it is quenched into an amorphous matrix 116. As before, a cesium source 118 and a dopant source 120 are used. The use of lasers to sputter carbon is known to those skilled in the art. Suitable laser arrangements for such purposes are well known in the prior art. One such arrangement can be found in Pappas, D. L. et al., Journal of Applied Physics v. 71, n. 11, (1992), whose contents are incorporated by reference.

In general, a cesium source can be added to many of the standard processes for carbon deposition to realize the results of the present invention. For instance, cathodic arc methods, plasma-enhanced chemical vapor deposition (CVD), and hybrids of these can all be used to co-deposit cesium into an amorphous diamond matrix. The critical factor is that the cesium and the carbon must be energetic enough to be quenched into the amorphous matrix. At the same time, they must not be so energetic that they prevent accumulation of the energetic particles in an amorphous matrix.

A number of samples were prepared and tested. The tests were conducted to determine the stability and the performance of devices formed in accordance with the present invention under varying environmental conditions.

Table 1 presents the results achieved by forming an amorphous matrix in accordance with the present invention, using a single ion beam process. The samples in Table 1 were formed by having a cesium ion beam bombard a carbon target, with the cesium and the carbon being co-deposited. More particularly, Table 1 presents the effects of imparting different levels of energy, on average, to the carbon ions. Table 1 shows that as the carbon ion energy is increased, the $sp^3/sp^2$ratio in the growing amorphous matrix is increased as well. This is because higher-energy carbon results in more $sp^3$ bonding. Conversely, $sp^2$ bonding predominates at low carbon ion energies. Table 1 also shows that as the carbon ion energy is increased, the resulting Cs/C ratio in the final composition decreases. This is because the increased carbon ion energy is produced by higher energy cesium bombarding the carbon.

TABLE 1

Effects of Varying Carbon Ion Energies

| Sample | C ion energy (eV) | $sp^3/sp^2$ (%) | Cs/C (%) | Work Function |
|---|---|---|---|---|
| A | 25 | 25 | 24 | 1.240 |
| B | 50 | 50 | 22 | 1.180 |
| C | 100 | 75 | 16 | 1.160 |
| D | 125 | 83 | 16 | 1.150 |
| E | 150 | 90 | 15 | 1.120 |

Table 2 shows the effects of heating, on the work function of a single sample formed in accordance with the present invention. Table 2 presents the measurements recorded at various temperatures. What is significant is that the work function stays relatively low, at most 1.21 eV, and remains fairly constant, despite subjecting the sample to temperatures up to 900° C. It should be noted, however, that as the temperature of the sample is increased, both the $sp^3/sp^2$ ratio and the Cs/C ratio, both as measured by Auger spectroscopy, drop.

The principal use for a cesiated amorphous matrix in accordance with the present invention is for cold cathode field emission of electrons. With the present invention, electrons are emitted from the surface of the thin film at room temperature, under the influence of an electric field. The electric field can be created by applying a voltage potential between the surface of the thin film (which serves as the cathode) and an anode positioned a predetermined distance away.

TABLE 2

Effects of Heating a Single Sample

| Sample | Post-annealing temp (°C.) | $sp^3/sp^2$ (%) | Cs/C (%) | Work Function (eV) |
|---|---|---|---|---|
| F | 25 | 90 | 15 | 1.120 |
| F | 45 | 90 | 15 | 1.125 |
| F | 63 | 90 | 14 | 1.135 |
| F | 87 | 87 | 13 | 1.145 |
| F | 130 | 80 | 11 | 1.165 |
| F | 190 | 75 | 10 | 1.175 |
| F | 230 | 75 | 9 | 1.175 |
| F | 420 | 70 | 7 | 1.175 |
| F | 520 | 65 | 2 | 1.190 |
| F | 640 | 45 | 1 | 1.185 |
| F | 800 | 25 | 1 | 1.195 |
| F | 900 | 20 | 1 | 1.210 |

A cold cathode electron emitter has a broad application base and can be used in many settings calling for electron emission. In fact, a stable cold cathode source providing high brightness is preferable to a thermionic emitter. Thus, a device in accordance with the present invention may find use in fluorescent light bulbs, magnetrons for microwave applications, cathode ray tubes and x-ray tubes. Thus, one attractive use is in display technology which relies on field emission devices. A device in accordance with the present invention may also find use in scientific instruments such as scanning electron microscopes, transmission electron microscopes, vacuum gauges, and the like.

Figure 5:
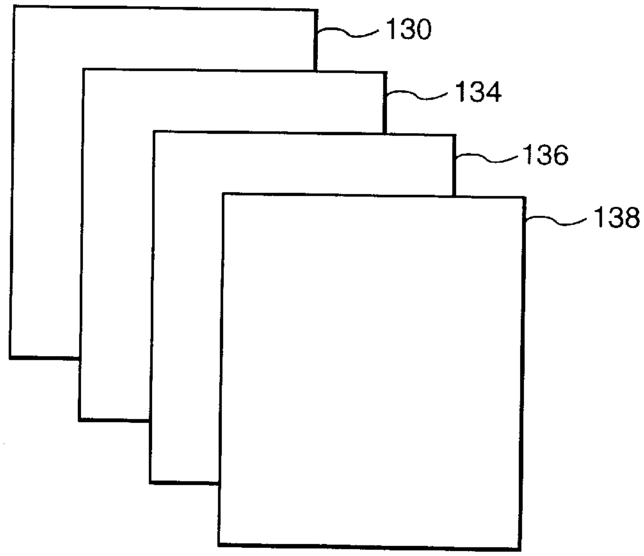
FIG. 5 illustrates an application of thin film made in accordance with the present invention.

FIG. 5 shows a schematic of a thin film 130 of the present invention arranged to be used as a display screen 132. A phoshor screen 134 is arranged parallel to the thin film 132 and positioned a predetermined distance away therefrom. Preferably, a vacuum is provided between the phosphor screen 134 and the thin film. Next to the phosphor screen is a transparent electrode material 136, such as indium tin oxide (ITO), arranged into a grid pattern. Finally, covering the ITO is glass 138, or equivalent. The thin film emits electrons which accelerate across the vacuum into the phosphor which, in turn produces light.

A thin film made in accordance with the present invention may also be used in a scanning electron microscope. In an electron microscope, lanthanum hexaboride is used as an electron emitter for indicating the contours of the scanned surface. However, lanthanum hexaboride is a low work function material which has to be heated to emit electrons. A thin film of amorphous carbon with cesium dispersed therein, coated on a field emission tip, may be used in place of the lanthanum hexaboride emitters, thus obviating the need for heating.

While the preferred embodiment is an amorphous diamond matrix, it should be kept in mind that an amorphous matrix may also be formed from other materials. In such case, the carbon target is replaced with a target formed from one of these other materials, and the process executed in much the same way. Other materials suitable for forming an amorphous matrix in this manner include diamond-like carbon, silicon nitride, carbon nitride, aluminum nitride and aluminum oxide.

Of these, diamond-like carbon (DLC) is similar in many ways to amorphous diamond. Unlike a-D, DLC has hydrogen atoms and a density which approaches that of graphite, i.e., 2.2 g/cc, rather than that of diamond, which is 3.5 g/cc. Thus, DLC has a more open tetrahedral structure than a-D. Nevertheless, because its electrical properties and inertness, are similar to that of a-D, DLC is also a good choice for forming the amorphous matrix.

While the present invention has been described with respect to certain preferred embodiments, the scope of the invention is not limited to the disclosed embodiments, but rather is set forth in the claims presented below.

What is claimed is:

1. A composition of matter comprising an amorphous matrix having cesium dispersed in said matrix, said cesium being present in substantially non-crystalline form.

2. The composition of matter according to claim 1, wherein the percentage of cesium is between 0.01 and 25% of a base material comprising the matrix and the matrix has at least 50% $sp^3$ bonding.

3. The composition of matter according to claim 1 wherein the amorphous matrix is formed from one of the group consisting of diamond, diamond-like carbon, silicon nitride, carbon nitride, aluminum nitride and aluminum oxide.

4. The composition of claim 3 wherein the dispersed cesium is present in the form of one from the group consisting of cesium atoms, cesium iodide, cesium oxide, and mixtures thereof.

5. The composition of matter according to claim 3, further comprising dopants, said dopants selected from the group consisting of nitrogen, phosphorous, boron, sodium, oxygen, lithium, borene, diborene, phosphene, nitrogen, ammonia, urea and mixtures thereof.

6. A composition of matter comprising an amorphous diamond matrix having cesium dispersed in said matrix, wherein the percentage of cesium is between 0.01 and 25% of the carbon content of the matrix and the matrix has at least 50% $sp^3$ bonding.

7. The composition of claim 6 wherein the cesium is present in the form of one from the group consisting of cesium atoms, cesium iodide, cesium oxide, and mixtures thereof.

8. A composition of matter comprising a diamond-like carbon matrix having cesium dispersed in said matrix, said cesium being present in substantially non-crystalline form, wherein the percentage of cesium is between 0.01 and 25% of the carbon content of the matrix and the matrix has at least 50% $sp^3$ bonding.

* * * * *